(12) United States Patent
Margairaz et al.

(10) Patent No.: US 6,985,710 B1
(45) Date of Patent: Jan. 10, 2006

(54) IMAGE REJECTION MIXER FOR BROADBAND SIGNAL RECEPTION

(75) Inventors: Didier Margairaz, Saratoga, CA (US); Alain-Serge Porret, Sunnyvale, CA (US); Dominique Python, Sunnyvale, CA (US); Pierre Favrat, Sunnyvale, CA (US)

(73) Assignee: Xceive Corporation, Santa Clara, CA (US)

( * ) Notice: Subject to any disclaimer, the term of this patent is extended or adjusted under 35 U.S.C. 154(b) by 518 days.

(21) Appl. No.: 10/236,581

(22) Filed: Sep. 6, 2002

Related U.S. Application Data (60) Provisional application No. 60/322,549, filed on Sep. 17, 2001.

(51) Int. Cl.
*H04B 1/10* (2006.01)

(52) U.S. Cl. ............ 455/302; 455/266; 455/307; 455/323

(58) Field of Classification Search ........ 455/302, 455/295, 296, 303, 304, 306, 307, 314, 318, 455/323, 324, 340, 266; 375/346, 349
See application file for complete search history.

(56) References Cited

U.S. PATENT DOCUMENTS

| | | | |
|---|---|---|---|
| 5,060,297 A | 10/1991 | Ma et al. | 455/302 |
| 6,127,962 A * | 10/2000 | Martinson | 342/20 |
| 6,226,509 B1 | 5/2001 | Mole et al. | 455/302 |
| 6,766,178 B1 * | 7/2004 | Damgaard et al. | 455/552.1 |

* cited by examiner

*Primary Examiner*—Nguyen T. Vo
(74) *Attorney, Agent, or Firm*—Patent Law Group LLP; Carmen C. Cook (57) ABSTRACT

An image rejection mixer includes an input terminal for receiving an input radio frequency (RF) signal, a mode selector coupled to the input terminal generating an output signal for either high side mixing or low side mixing, a first mixer coupled to receive the input RF signal and a signal from a local oscillator providing a signal having a local oscillator frequency, a phase converter coupled to convert the phase of the signal from the local oscillator, a second mixer coupled to receive the output signal from the mode selector and the phase-converted local oscillator signal, and a tunable polyphase filter coupled to receive output signals from the first mixer and the second mixer, the tunable polyphase filter providing an output signal having a variable intermediate frequency. In one embodiment, the variable intermediate frequency the tunable polyphase filter is implemented as a switchable intermediate frequency.

20 Claims, 7 Drawing Sheets

IMAGE REJECTION MIXER FOR BROADBAND SIGNAL RECEPTION

CROSS-REFERENCE TO RELATED APPLICATION

The present application claims the benefit of U.S. Provisional Patent Application No. 60/322,549, filed Sep. 17, 2001, and entitled "Image rejection mixer for broadband signal reception employing a variable or switchable intermediate frequency", which application is incorporated herein by reference in its entirety.

FIELD OF THE INVENTION

The present invention relates to television tuners, and more particularly to an image rejection mixer for use in a tuner for rejecting undesired image frequencies.

DESCRIPTION OF THE RELATED ART

Figure 1:
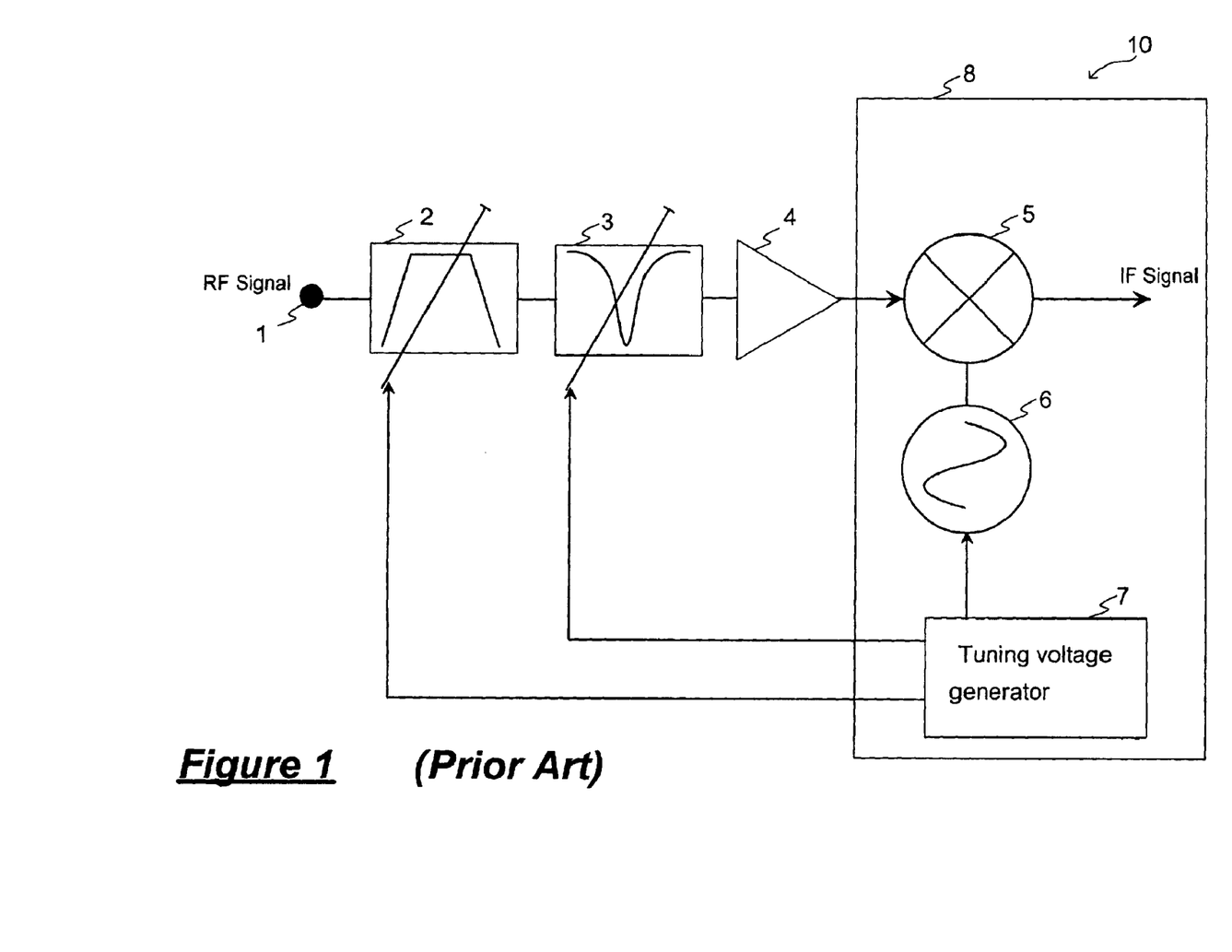
FIG. 1 is a conventional tuning system which can be used for the reception of low VHF, VHF and UHF broadcast channels.

Conventional television receivers employ a tuner to tune or select the desired radio frequency (RF) signals in a given frequency range (6 MHz) to the exclusion of all other signals in order to receive the desired channel. FIG. 1 is a conventional tuning system which can be used for the reception of low VHF, VHF and UHF broadcast channels. Referring to FIG. 1, tuning system 10 receives RF input signals on an input terminal 1. The input RF signal can be received from terrestrial broadcast or cable transmissions. The input RF signal is coupled to an RF input circuit including a bandpass filter 2, a bandstop filter 3 (also known as a "trap or notch filter"), and an RF amplifier 4 whose gain could be externally controlled. The output signal of the RF input circuit is coupled to a tuner circuit 8, typically an integrated circuit, for tuning the filtered input RF signal to the desired frequency range and generating an IF signal having an intermediate frequency. Tuner 8 may include one or more mixers, denoted by a mixer 5, and one or more variable local oscillators, denoted by variable local oscillator 6. A tuning voltage generator 7 in tuner circuit 8 generates a control signal for controlling bandpass filter 2, bandstop filter 3 and variable local oscillator 6 for tuning to the desired channel.

In tuner system 10, the input RF signal for a selected channel is converted to an intermediate frequency by one or more frequency conversions using mixers 5. The frequency of local oscillators 6 is selected based on the intermediate frequency assigned to the receiver and the desired channel. The frequency conversion is called a "down conversion" if the intermediate frequency is lower than the frequency of the signal at the input of the mixer. Furthermore, the frequency conversion is called "low-side mixing" if the frequency of the local oscillator is lower than the frequency of the input RF signal. On the other hand, the frequency conversion is called "high-side mixing" if the frequency of the local oscillator is higher than the frequency of the input RF signal.

The mathematical relations between the input RF frequency ($f_{RF}$), the local oscillator frequency ($f_{LO}$) and the intermediate frequency ($f_{IF}$) can be described as follows:

$$f_{IF} = f_{RF} - f_{LO} \text{ (down-conversion, low-side mixing);} \quad \text{Eq. Ia.}$$

and $$f_{IF} = f_{LO} - f_{RF} \text{ (down-conversion, high-side mixing).} \quad \text{Eq. IIa.}$$

One common problem encountered by conventional tuner systems is the presence of unwanted signals at an image frequency ($f_{image}$) with the wanted signal at the input RF frequency ($f_{RF}$). The operation of the mixers in the tuner circuit will actually convert the unwanted signals together with the wanted signals. The unwanted signals become superimposed on the wanted signal at the intermediate frequency, resulting in interferences. The relationship of the image frequency ($f_{image}$) to the local oscillator frequency ($f_{LO}$) and the intermediate frequency ($f_{IF}$) for down conversion and low-side mixing is given as follows:

$$f_{image} = f_{LO} - f_{IF} \quad \text{Eq. Ib.}$$

The relationship of the image frequency ($f_{image}$) to the local oscillator frequency ($f_{LO}$) and the intermediate frequency ($f_{IF}$) for down conversion and high-side mixing is given as follows:

$$f_{image} = f_{LO} + f_{IF} \quad \text{Eq. IIb.}$$

Figure 2:
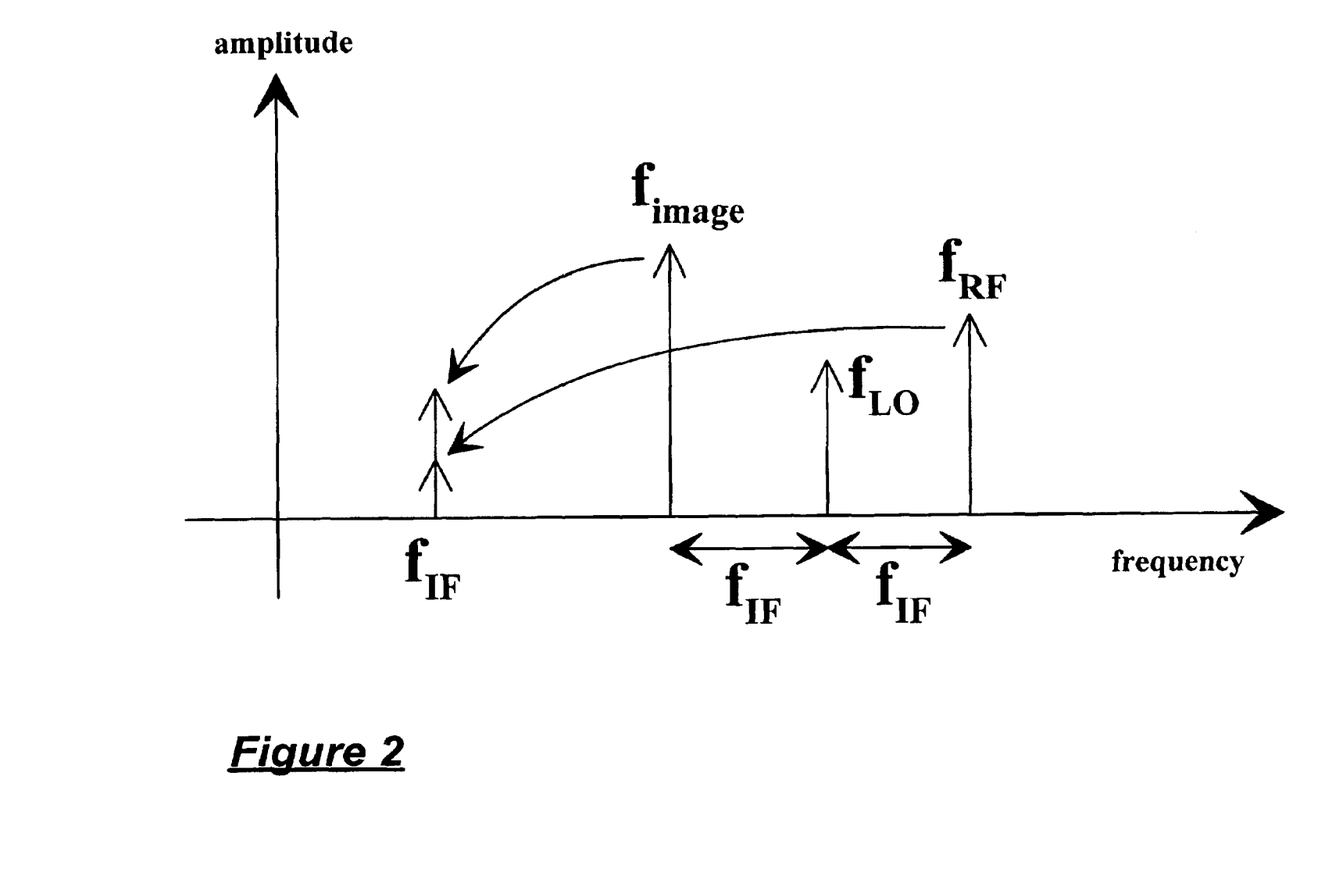
FIG. 2 is a frequency domain representation illustrating the interference problem introduced by an image frequency in a down-conversion, low-side mixing scheme.

FIG. 2 is a frequency domain representation illustrating the interference problem introduced by an image frequency in a down-conversion, low-side mixing scheme. Referring to FIG. 2, the $f_{RF}$ frequency of the input signal is down-converted to an intermediate frequency $f_{IF}$, as given by Equation Ia above. However, the unwanted frequency $f_{image}$ is also down-converted to the same $f_{IF}$ intermediate frequency, as given by Equation Ib above. In the example shown in FIG. 2, the amplitude level of the unwanted signal is even higher than the amplitude of the wanted signal, resulting in a strong interference and corruption of information encoded in the input RF signal.

Methods for eliminating the unwanted image frequency during the conversion of an RF signal to an intermediate frequency are known. The conventional methods include filtering out the image frequency prior to frequency conversion or applying an image rejection mixer.

Figure 3:
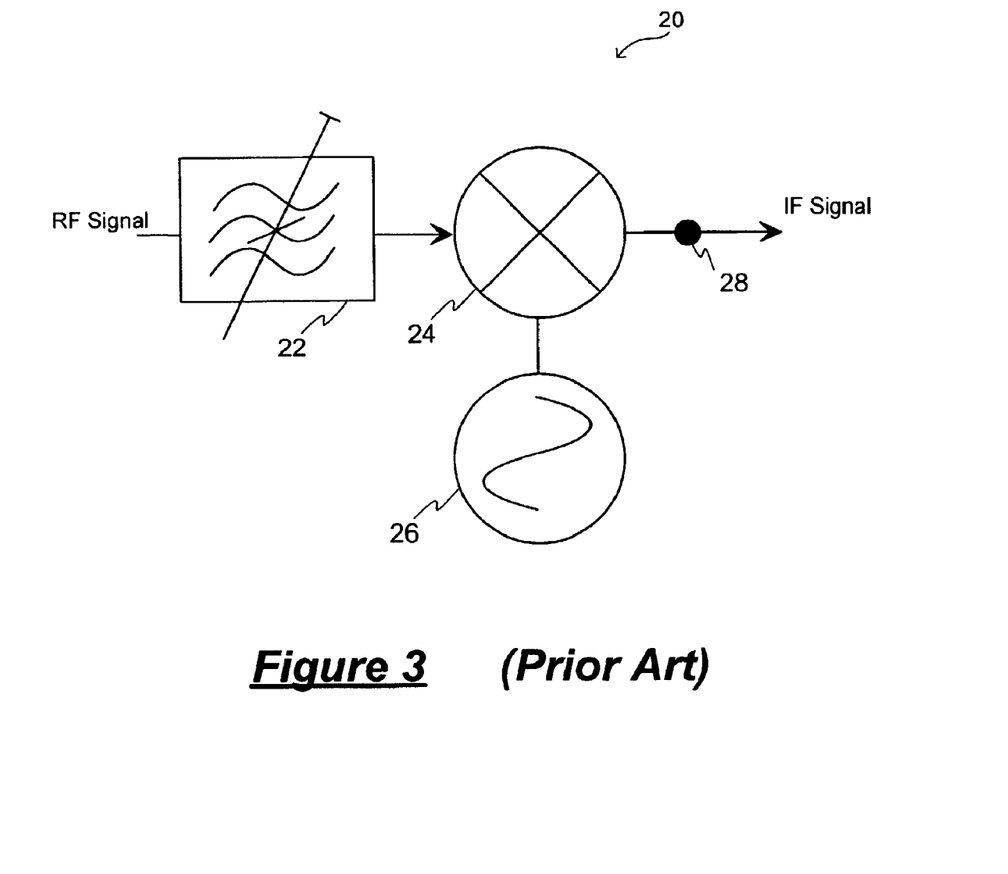
FIG. 3 is a circuit diagram illustrating the use of a trap filter to attenuate the image frequency in a conventional tuner system.

FIG. 3 is a circuit diagram illustrating the use of a trap filter to attenuate the image frequency in a conventional tuner system. Referring to FIG. 3, a tunable trap filter 22 receives the input RF signals and removes the image frequency from the input RF signal prior to coupling the input RF signal to a mixer 24. Mixer 24 converts the filtered input RF signal to an intermediate frequency signal by mixing the frequency of the input RF signal with the frequency of a local oscillator 26. The frequency $f_{IF}$ of the intermediate frequency signal at an output terminal 28 is given by the relationships of one of equations Ia and IIa above, where $f_{RF}$ is the frequency of the input RF signal and $f_{LO}$ is the frequency of local oscillator 26.

The image rejection method of FIG. 3 has several shortcomings. First, because of television signals have a wide frequency range, a number of tunable trap filters is needed to handle the attenuation of the image frequencies in the entire frequency range. Consequently, a tuner thus constructed may have poor rejection performance.

Figure 4:
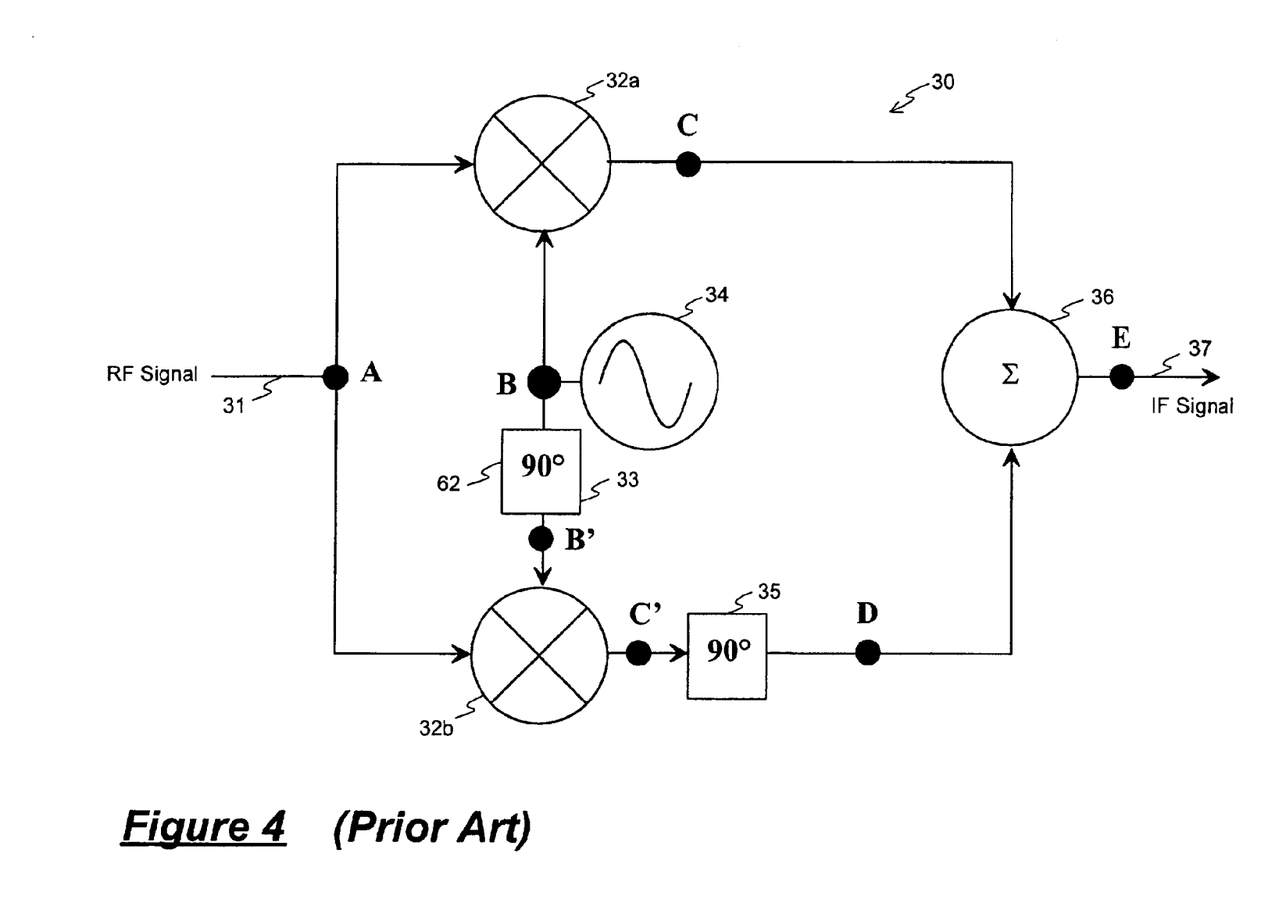
FIG. 4 is a circuit diagram of a prior art image rejection mixer.

FIG. 4 is a circuit diagram of a prior art image rejection mixer. Image rejection mixer 30 receives input RF signals on an input terminal 31. The input RF signals having a frequency $f_{RF}$ are coupled to two mixers 32a and 32b to be converted to an intermediate frequency at frequency $f_{IF}$. A tunable voltage-controlled oscillator (VCO) 34 provides the local frequency for tuning to the desired broadcast channel. A phase converter 33 is coupled between VCO 34 and mixer 32b. Another phase converter 35 is coupled between mixer 32b and a summer (or substractor) 36. Summer 36 sums the mixed signals from mixer 32a and mixer 32b to generate the IF signal at frequency $f_{IF}$.

The mathematical equations describing the operation of image rejection mixer 30 are given below. In the present description, image rejection mixer 30 is operating in a down-conversion, low-side mixing scheme. However, the equations are also applicable for a high-side mixing scheme.

At point A, the input RF signals are given as:

$$A = V_{rf} \sin(2\cdot\pi\cdot f_{RF}\cdot t) + V_{image} \sin(2\cdot\pi\cdot f_{image}\cdot t),$$

At point B, the signal of VCO 34 is given as:

$$B = V_{lo} \sin[2\cdot\pi\cdot(f_{RF} - f_{IF})\cdot t]$$

At point B', the signal of VCO 34 after phase converter 33 is given as:

$$B' = V_{lo} \cdot \sin[2\cdot\pi\cdot(f_{RF} - f_{IF})\cdot t + 90°] = \ldots = \ldots$$
$$= V_{lo} \cdot \cos[2\cdot\pi\cdot(f_{RF} - f_{IF})\cdot t]$$

Assume g is the conversion gain of mixer 32a, the signal at the output of mixer 32a, i.e. at point C, is given as:

$$C = g \cdot A \cdot B = \ldots$$
$$= g \cdot V_{rf} \cdot \sin[2\cdot\pi\cdot f_{RF}\cdot t] \cdot V_{lo} \cdot$$
$$\sin[2\cdot\pi\cdot(f_{RF} - f_{IF})\cdot t] + \ldots + g \cdot V_{image} \cdot \sin[2\cdot\pi\cdot f_{image}\cdot t] \cdot$$
$$V_{lo} \cdot \sin[2\cdot\pi\cdot(f_{RF} - f_{IF})\cdot t]$$
$$= g \cdot V_{rf} \cdot \sin[2\cdot\pi\cdot f_{RF}\cdot t] \cdot V_{lo} \cdot \sin[2\cdot\pi\cdot(f_{RF} - f_{IF})\cdot t] + \ldots +$$
$$g \cdot V_{image} \cdot \sin[2\cdot\pi\cdot(f_{RF} - 2\cdot f_{IF})\cdot t] \cdot V_{lo} \cdot$$
$$\sin[2\cdot\pi\cdot(f_{RF} - f_{IF})\cdot t]$$
$$= g \cdot V_{lo} \cdot V_{rf} \cdot \frac{1}{2} \cdot \{\cos[2\cdot\pi\cdot(-f_{IF})\cdot t] -$$
$$\cos[(2\cdot f_{RF} - 3\cdot f_{IF})\cdot t]\} + \ldots + \ldots + g \cdot V_{lo} \cdot V_{image} \cdot \frac{1}{2} \cdot$$
$$\{\cos[2\cdot\pi\cdot(-f_{IF})\cdot t] - \cos[(2\cdot f_{RF} - 3\cdot f_{IF})\cdot t]\}$$

At that point, the undesirable frequencies are removed. So, at point C, the signal is given as:

$$C = g \cdot V_{lo} \cdot V_{rf} \cdot \frac{1}{2} \cdot \cos[2\cdot\pi\cdot f_{IF}\cdot t] + \ldots + \ldots g \cdot V_{lo} \cdot V_{image} \cdot$$
$$\frac{1}{2} \cdot \cos[2\cdot\pi\cdot(-f_{IF})\cdot t]$$
$$= g \cdot V_{lo} \cdot V_{rf} \cdot \frac{1}{2} \cdot \cos[2\cdot\pi\cdot f_{IF}\cdot t] + g \cdot V_{lo} \cdot V_{image} \cdot$$
$$\frac{1}{2} \cdot \cos[2\cdot\pi\cdot f_{IF}\cdot t]$$

The same equations can be written for the signal at the output of mixer 32b, i.e. at point C', as follows:

$$C = g \cdot A \cdot B' = \ldots = g \cdot V_{rf} \cdot \sin[2\cdot\pi\cdot f_{RF}\cdot t] \cdot V_{lo} \cdot$$
$$\cos[2\cdot\pi\cdot(f_{RF} - f_{IF})\cdot t] + \ldots + g \cdot V_{image} \cdot \sin[2\cdot\pi\cdot f_{image}\cdot t] \cdot$$
$$V_{lo} \cdot \cos[2\cdot\pi\cdot(f_{RF} - f_{IF})\cdot t]$$
$$= g \cdot V_{rf} \cdot \sin[2\cdot\pi\cdot f_{RF}\cdot t] \cdot V_{lo} \cdot \cos[2\cdot\pi\cdot(f_{RF} - f_{IF})\cdot t] + \ldots +$$
$$g \cdot V_{image} \cdot \sin[2\cdot\pi\cdot f_{RFe} - 2\cdot f_{IF})\cdot t \cdot V_{lo} \cdot \cos[2\cdot\pi\cdot(f_{RF} - f_{IF})\cdot t]$$
$$= g \cdot V_{lo} \cdot V_{rf} \cdot \frac{1}{2} \cdot \{\sin[2\cdot\pi\cdot f_{IF}\cdot t] +$$
$$\sin[2\cdot\pi\cdot(f_{RF} - f_{IF})\cdot t]\} + \ldots + \ldots + g \cdot V_{lo} \cdot V_{image} \cdot$$

-continued
$$\frac{1}{2} \cdot \{\sin[2\cdot\pi\cdot(-f_{IF})\cdot t] - \sin[(2\cdot f_{RF} - 3\cdot f_{IF})\cdot t]\}$$

At that point, the undesirable frequencies are removed. So, at point C', the signal is given as:

$$C' = g \cdot V_{lo} \cdot V_{rf} \cdot \frac{1}{2} \cdot \sin[2\cdot\pi\cdot f_{IF}\cdot t] + \ldots + \ldots + g \cdot V_{lo} \cdot$$
$$V_{image} \cdot \frac{1}{2} \cdot \sin[2\cdot\pi\cdot(-f_{IF})\cdot t]$$
$$= g \cdot V_{lo} \cdot V_{rf} \cdot \frac{1}{2} \cdot \sin[2\cdot\pi\cdot f_{IF}\cdot t] - g \cdot V_{lo} \cdot$$
$$V_{image} \cdot \frac{1}{2} \cdot \sin[2\cdot\pi\cdot f_{IF}\cdot t]$$

At point D, the signal after phase converter 35 is given as:

$$D = g \cdot V_{lo} \cdot V_{rf} \cdot \frac{1}{2} \cdot \sin[2\cdot\pi\cdot f_{IF}\cdot t + 90°] \ldots + g \cdot V_{lo} \cdot V_{image} \cdot \frac{1}{2} \cdot$$
$$\sin[2\cdot\pi\cdot f_{IF}\cdot t + 90°] = \ldots$$
$$= g \cdot V_{lo} \cdot V_{rf} \cdot \frac{1}{2} \cdot \cos[2\cdot\pi\cdot f_{IF}\cdot t] \ldots + g \cdot V_{lo} \cdot V_{image} \cdot \frac{1}{2} \cdot$$
$$\cos[2\cdot\pi\cdot f_{IF}\cdot t]$$

At point E, the signal after summer 36, that is the IF signal, is given as:

$$E = C + D$$
$$= \frac{g \cdot V_{lo}}{2} \cdot \{V_{rf} \cdot \cos[2\cdot\pi\cdot f_{IF}\cdot t] + V_{iamge} \cdot \cos[2\cdot\pi\cdot f_{IF}\cdot t]\} \ldots +$$
$$\frac{g \cdot V_{lo}}{2} \cdot \{V_{rf} \cdot \cos[2\cdot\pi\cdot f_{IF}\cdot t] - V_{image} \cdot \cos[2\cdot\pi\cdot f_{IF}\cdot t]\} = \ldots$$
$$= g \cdot V_{lo} \cdot V_{rf} \cdot \cos[2\cdot\pi\cdot f_{IF}\cdot t]$$

The last equation proves that the image frequency is completely removed at point E, the output terminal of image rejection mixer 30.

Figure 5:
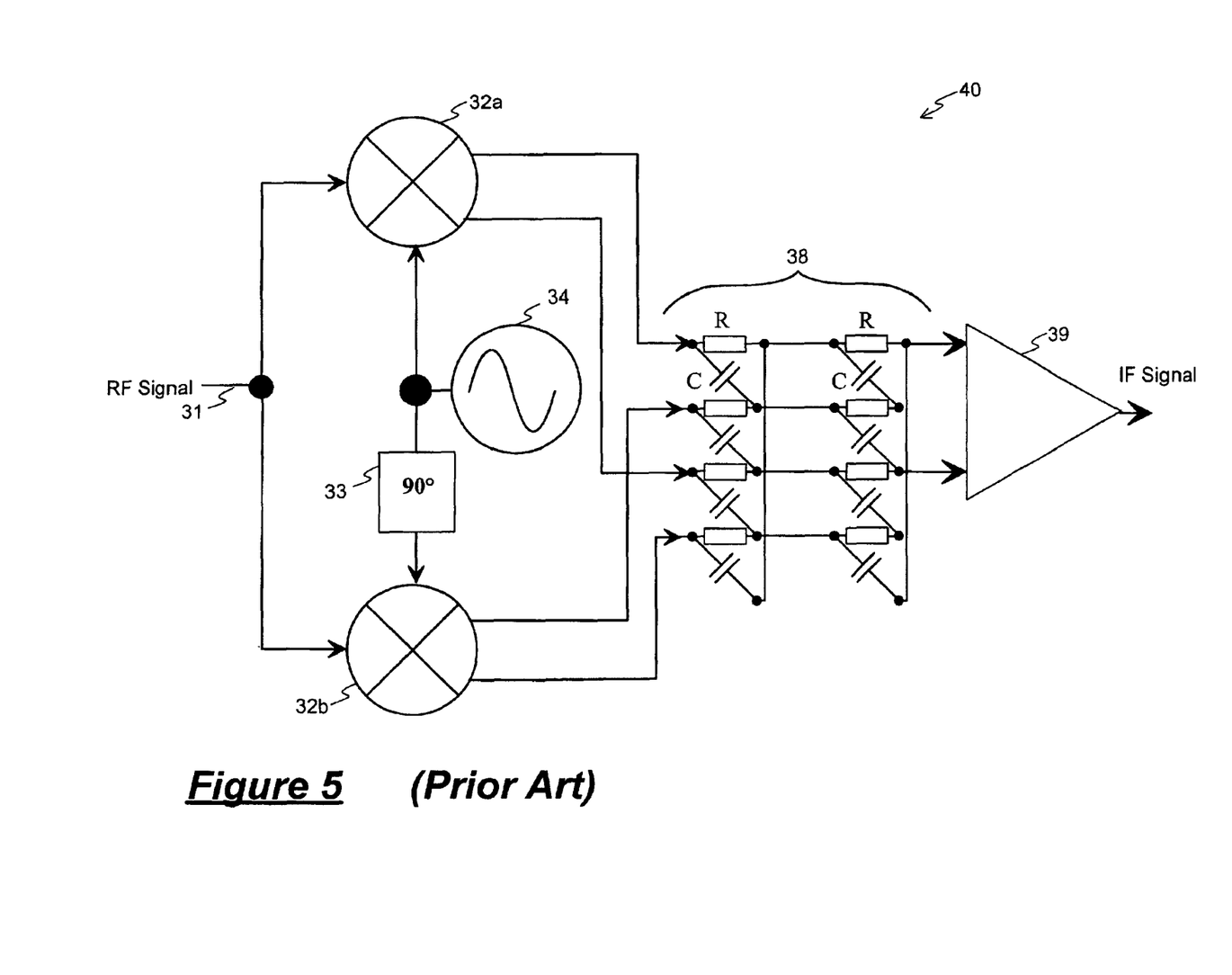
FIG. 5 illustrates one actual implementation of the image rejection mixer described in FIG. 4.

FIG. 5 illustrates one actual implementation of the image rejection mixer described in FIG. 4 for a down conversion, high-side mixing scheme. Like elements in FIGS. 4 and 5 are given like reference numerals for ease of discussion. Referring to FIG. 5, input RF signals are received at an input terminal 31 and are coupled to a mixer 32a and to a mixer 32b.

A tunable voltage controlled oscillator (VCO) 34 provides the local frequency to tune to the desired channel. A 90° phase converter 33 converts the local frequency signal from VCO 34 before coupling the signal to mixer 32b.

Image rejection mixer 40 includes filtering function after the mixing operations as realized by a polyphase filter 38. Polyphase filter 38 realizes the phase conversion function of phase converter 35 of FIG. 4 and the summing function of summer 36. In some implementation, several polyphase filters are added in series in order to increase the total bandwidth at the intermediate frequency. An amplifier 7 is coupled to the output terminal of polyphase filter 38 to provide additional gain to the image-rejection mixer. Image rejection mixer 40 generates an output IF signal at a preselected, fixed intermediate frequency.

While image rejection mixer 40 can operate effectively to eliminate unwanted signals, the image rejection mixer 40 cannot be completely integrated in a tuner system. The use of discrete external components for additional filtering, such as in the trap filter, cannot be completely removed.

An improved image rejection mixer is desired, especially to work in tuners adapted for multi-standard receivers.

SUMMARY OF THE INVENTION

According to one embodiment of the present invention, a mixer includes an input terminal for receiving an input radio frequency (RF) signal, a mode-selector coupled to the input terminal where the mode selector generates an output signal responsive to a mode select signal selecting a high side mixing mode or a low side mixing mode, a first mixer coupled to receive the input RF signal and a signal from a local oscillator providing a signal having a local oscillator frequency, a phase converter coupled to convert the phase of the signal from the local oscillator, a second mixer coupled to receive the output signal from the mode selector and the phase-converted local oscillator signal, and a tunable polyphase filter coupled to receive output signals from the first mixer and the second mixer, the tunable polyphase filter providing an output signal having a variable intermediate frequency.

In one embodiment, the variable intermediate frequency of the tunable polyphase filter is implemented as a switchable intermediate frequency. The tunable polyphase filter includes multiple fixed frequency polyphase filters and multiple switches. Each of the fixed frequency polyphase filters is coupled to a pair of switches where each pair of switches is controlled by a corresponding select signal. In response to the select signal, each pair of switches couple output signals from the first mixer and the second mixer to a corresponding polyphase filter.

The present invention is better understood upon consideration of the detailed description below and the accompanying drawings.

DETAILED DESCRIPTION OF THE PREFERRED EMBODIMENTS

In accordance with the principles of the present invention, an image rejection mixer includes a tunable polyphase filter and uses a variable internal intermediate frequency to convert input RF signals and to perform image rejection. In one embodiment, the variable internal intermediate frequency is implemented as multiple, switchable internal intermediate frequencies where a given internal intermediate frequency is selected to enhance image rejection and to improve the performance of the mixer. The image rejection mixer of the present invention provides filtering of the input RF signal so that the requirements for filtering in preceding filter stages can be relaxed. Furthermore, the image rejection mixer of the present invention eases the implementation burden of the filtering functions, thus eliminating the use of external discrete components. The image rejection mixer of the present invention can thus be integrated with other tuner circuitry onto a single integrated circuit to yield a fully integrated tuner system.

The advantageous result of applying a variable internal intermediate frequency in the image rejection mixer of the present invention will be explained with reference to FIG. 2. Referring to FIG. 2 and Equations Ib and IIb above, in the case of a down conversion and low-side mixing scheme, the undesirable frequency $f_{image}$ is at a frequency $f_{LO}-f_{IF}$. A trap filter applied to eliminate the image frequency must have a frequency response that is capable of canceling out the image frequency $f_{image}$. By using a variable internal intermediate frequency in the image rejection mixer, the frequency range between the undesirable image frequency and the local oscillator frequency can be widen so that the image frequency can be cancelled without adversely affecting other signals. Furthermore, a wide frequency range between the image frequency and the local oscillator frequency provides for more tolerance in the design of the filter stages prior to the mixer. In conventional tuner systems for television signals, the mixer uses a fixed, preselected intermediate frequency while having had to handle a wide frequency range of the television signals. The fixed, preselected intermediate frequency imposes severe restrictions on the filtering stages prior to the mixer, making those filtering stages difficult to design. In accordance with the present invention, with the use of a variable internal intermediate frequency in an image rejection mixer, the design restrictions of the filter stages prior to the mixer can be relaxed.

The variable internal intermediate frequency in the image rejection mixer of the present invention is particularly useful when the final intermediate frequency is a low frequency value. Specifically, an internal intermediate frequency that is larger than the final intermediate frequency can be selected. As a result, a wide frequency range between the image frequency and the local oscillator frequency can be realized which in turn makes the implementation of a trap filter for image rejection in prior stages easier. More importantly, relaxing the specification of the filter stages allow the complete circuitry of the tuner to be integrated onto a single integrated circuit, realizing an integrated tuner system or an integrated receiver system.

Another advantage of using a variable internal intermediate frequency in the image rejection mixer of the present invention is that the image rejection mixer can be applied in a tuner system providing a variable or tunable intermediate frequency. A tuner system providing a variable intermediate frequency enables the construction of multi-standard receiver as described in copending and commonly assigned U.S. patent application Ser. No. 10/236,645, entitled "Broadband Receiver Having a Multistandard Channel Filter", by Favrat et al., which application is incorporated herein by reference in its entirety.

Figure 6:
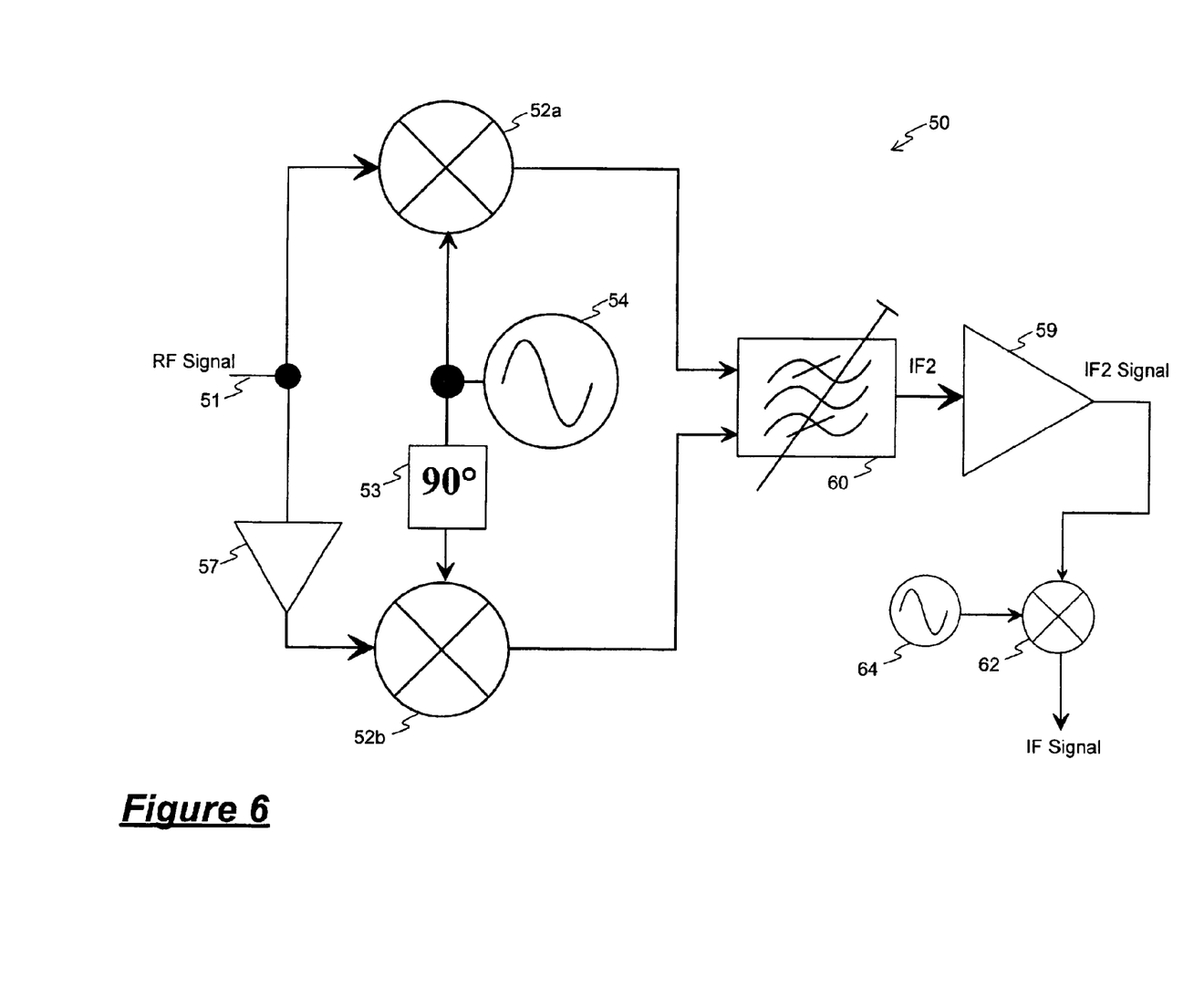
FIG. 6 is a block diagram of an image rejection mixer with a variable internal intermediate frequency according to one embodiment of the present invention.

FIG. 6 is a block diagram of an image rejection mixer with a variable internal intermediate frequency according to one embodiment of the present invention. Referring to FIG. 6, image rejection mixer 50 receives input RF signal on an input terminal 51. An amplifier 57, coupled to the input terminal, has a switchable gain of either 1 or −1. The gain of amplifier 57 is determined by the operation mode (high-side mixing or low-side mixing) of image rejection mixer 50. The gain of amplifier 57 is selected to be −1 in to remove the image frequency in a down conversion, low-side mixing scheme. In a down conversion, high-side mixing scheme, the gain of the amplifier 57 is selected to be 1 to remove the image frequency. Mixers 52a and 52b together with a tunable voltage controlled oscillator 54 are provided for tuning mixer 50 to the desired channel. The local oscillator frequency is phase converted by 90° phase converter 53 before being coupled to mixer 52b. Image rejection mixer 50 includes a tunable polyphase filter 60 and an output amplifier 59.

In another embodiment, phase converter 53 in image rejection mixer 50 can provide a −90° of phase conversion. In that case, the polarity of the gain of amplifier 57 is reversed. That is, the gain of amplifier 57 is chosen to be equal to 1 in a down conversion, low-side mixing, and chosen to be −1 in a down conversion, high-side mixing.

The operation of image rejection mixer 50 is similar to mixer 40 of FIG. 6 except that the incorporation of tunable polyphase filter 60 permits the use of a variable internal intermediate frequency, IF2, in mixer 50. The internal intermediate frequency IF2 is selected to enhance the performance of the mixer and to ease the requirement of the prior filter stages (such as trap filters used to eliminate the image frequency).

The output signals from amplifier 59 have an intermediate frequency of IF2. The output signal is typically coupled to another mixer, such as mixer 62, or a series of mixers, and local oscillator 64, or a series of local oscillators to be converted to the final intermediate frequency desired for the tuner system or the receiver system.

Figure 7:
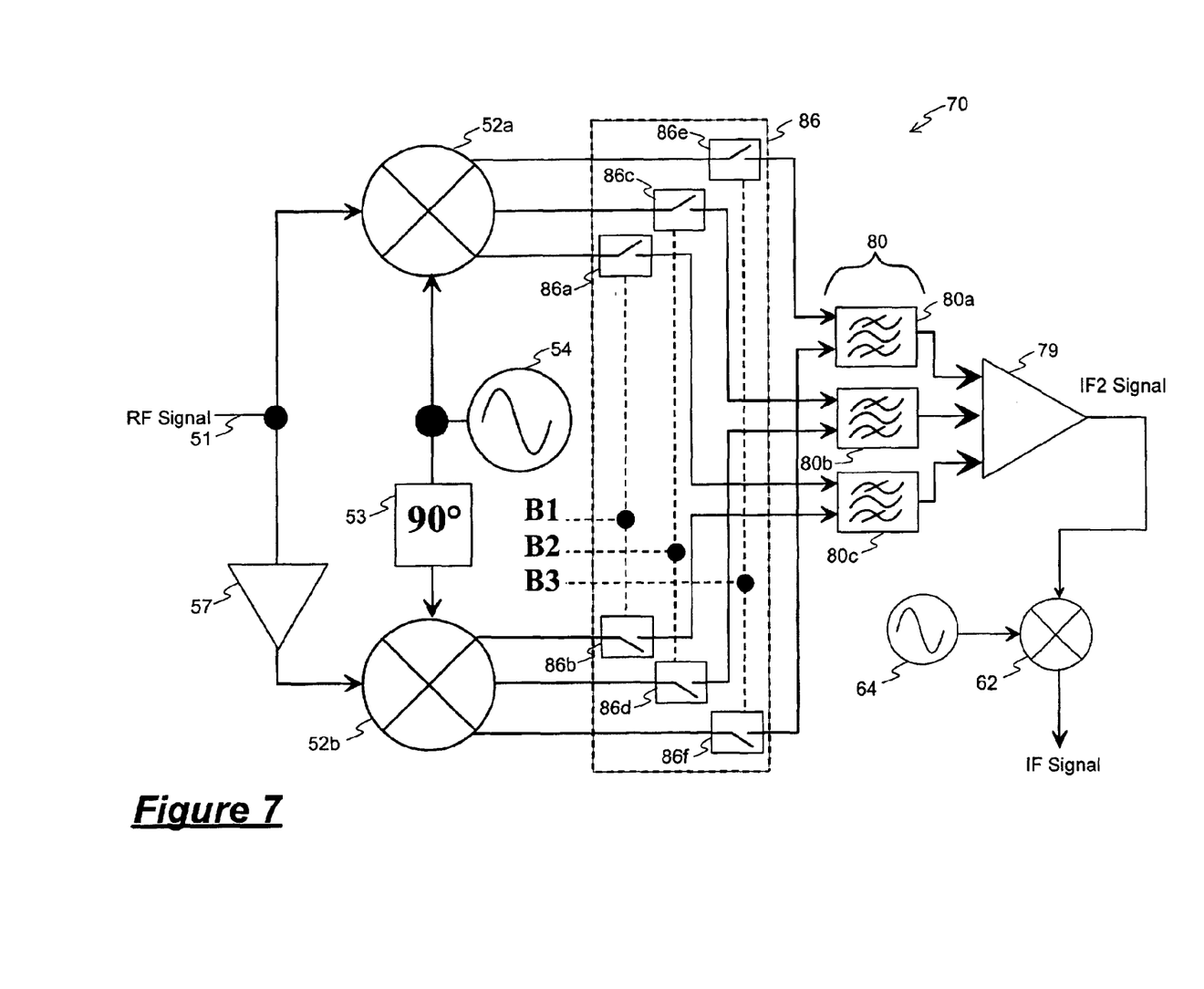
FIG. 7 is a block diagram of an image rejection mixer according to an alternate embodiment of the present invention.

FIG. 7 is a block diagram of an image rejection mixer according to an alternate embodiment of the present invention. Like elements in FIGS. 6 and 7 are given like reference numerals to simplify the discussion. Referring to FIG. 7, the variable internal intermediate frequency of image rejection mixer 70 is implemented with switchable internal intermediate frequencies. In the present embodiment, three different internal intermediate frequencies are provided. A bank of switches 86 is used to select one fixed frequency polyphase filter from a bank of fixed frequency polyphase filters 80. Specifically, a pair of switches 86a and 86b couple the output signals from mixers 52a and 52b, respectively, to fixed frequency polyphase filter 80c. Similarly, a pair of switches 86c and 86d couple the output signals from mixers 52a and 52b, respectively to fixed frequency polyphase filter 80b. Finally, a pair of switches 86e and 86f couple the output signals from mixers 52a and 52b, respectively to fixed frequency polyphase filter 80a.

By selectively activating each pair of switches 86a to 86f, three different internal intermediate frequencies can be realized. Referring to FIG. 7, control signals B1, B2 and B3 are used to select each pair of switches. When one of the control signals B1, B2 and B3 is selected, the corresponding pair of switches are engaged, connecting the associated polyphase filter 80 between mixers 52a and 52b and an amplifier 79, thereby generating a signal having the selected internal intermediate frequency IF2.

The output signals from the bank of polyphase filters 80 are coupled to amplifier 79 which amplifies the signals having a frequency of IF2. The amplified signal can be coupled to other mixers, such as mixer 62, or a series of mixers to generate output signals having the desired final intermediate frequency.

In one embodiment, the fixed frequency polyphase filters 80a, 80b and 80c are each implemented in the same manner as polyphase filter 38 in FIG. 5. Thus, each of polyphase filters 80a, 80b and 80c can be implemented as a series of resistive elements and a series of capacitive elements, each capacitive element cross-coupled between two resistive elements, as shown in FIG. 5.

By incorporating a tunable polyphase filter, the image rejection mixer of the present invention provides additional image filtering such that the specification of the preceding trap filter stages can be relaxed. Furthermore, the use of variable internal intermediate frequencies provides flexibility in tuner system design as the requirements for prior filter stages can be relaxed without degrading the performance of the tuner system.

The above detailed descriptions are provided to illustrate specific embodiments of the present invention and are not intended to be limiting. Numerous modifications and variations within the scope of the present invention are possible. The present invention is defined by the appended claims.

We claim:

1. A mixer comprising:
   an input terminal for receiving an input radio frequency (RF) signal;
   a mode selector coupled to said input terminal, said mode selector generating an output signal responsive to a mode select signal selecting a high side mixing mode or a low side mixing mode;
   a first mixer coupled to receive said input RF signal and a signal from a local oscillator, said local oscillator providing a signal having a local oscillator frequency;
   a phase converter coupled to convert the phase of said signal from said local oscillator;
   a second mixer coupled to receive said output signal from said mode selector and said phase-converted local oscillator signal; and
   a tunable polyphase filter coupled to receive output signals from said first mixer and said second mixer, said tunable polyphase filter providing an output signal having a variable intermediate frequency.

2. The mixer of claim 1, wherein said tunable polyphase filter generates said output signal having an intermediate frequency that is greater than a final intermediate frequency for said input RF signal.

3. The mixer of claim 1, further comprising:
   an amplifier coupled to amplify said output signal of said tunable polyphase filter.

4. The mixer of claim 3, further comprising:
   a third mixer coupled to receive said amplified output signal from said amplifier and a second local oscillator frequency from a second local oscillator, said third mixer generating an output signal having a final intermediate frequency for said input RF signal.

5. The mixer of claim 4, wherein said final intermediate frequency is greater than said intermediate frequency of said output signal of said tunable polyphase filter.

6. The mixer of claim 1, wherein said mode selector comprises a first amplifier coupled to said input terminal, said first amplifier having a selectable gain for selecting between said high-side mixing mode or said low side mixing mode.

7. The mixer of claim 6, wherein when said phase converter provides a 90° phase conversion, said first amplifier has a gain of −1 when said low-side mixing mode is selected and said first amplifier has a gain of 1 when said high-side mixing mode is selected.

8. The mixer of claim 6, wherein when said phase converter provides a −90° phase conversion, said first amplifier has a gain of 1 when said low-side mixing mode is selected and said first amplifier has a gain of −1 when said high-side mixing mode is selected.

9. The mixer of claim 1, wherein said tunable polyphase filter comprises:
   a plurality of fixed frequency polyphase filters; and
   a plurality of switches;
   wherein each of said plurality of fixed frequency polyphase filters is coupled to a pair of switches in said plurality of switches, each pair of switches being controlled by a corresponding select signal and in response to said select signal, coupling output signals from said first mixer and said second mixer to a corresponding polyphase filter.

10. The mixer of claim 1, wherein said phase converter provides a 90 degree or −90 degree phase conversion.

11. The mixer of claim 1, wherein said local oscillator is a voltage controlled oscillator.

12. A mixer comprising:
    an input terminal for receiving an input radio frequency (RF) signal;
    a mode selector coupled to said input terminal, said mode selector generating an output signal responsive to a mode select signal selecting a high side mixing mode or a low side mixing mode;
    a first mixer coupled to receive said input RF signal and a signal from a local oscillator, said local oscillator providing a signal having a local oscillator frequency;
    a phase converter coupled to convert the phase of said signal from said local oscillator;
    a second mixer coupled to receive said output signal from said mode selector and said phase-converted local oscillator signal; and
    a tunable polyphase filter coupled to receive output signals from said first mixer and said second mixer, said tunable polyphase filter providing an output signal having a variable intermediate frequency, said tunable polyphase filter comprising:
      a plurality of fixed frequency polyphase filters; and
      a plurality of switches;
      wherein each of said plurality of fixed frequency polyphase filters is coupled to a pair of switches in said plurality of switches, each pair of switches being controlled by a corresponding select signal and in response to said select signal, coupling output signals from said first mixer and said second mixer to a corresponding polyphase filter.

13. The mixer of claim 12, wherein said tunable polyphase filter generates said output signal having an intermediate frequency that is greater than a final intermediate frequency for said input RF signal.

14. The mixer of claim 12, further comprising:
    an amplifier coupled to amplify said output signal of said tunable polyphase filter.

15. The mixer of claim 14, further comprising:
    a third mixer coupled to receive said amplified output signal from said amplifier and a second local oscillator frequency from a second local oscillator, said third mixer generating an output signal having a final intermediate frequency for said input RF signal.

16. The mixer of claim 15, wherein said final intermediate frequency is greater than said intermediate frequency of said output signal of said tunable polyphase filter.

17. The mixer of claim 12, wherein said mode selector comprises a first amplifier coupled to said input terminal, said first amplifier having a selectable gain for selecting between said high-side mixing mode or said low side mixing mode.

18. The mixer of claim 17, wherein when said phase converter provides a 90° phase conversion, said first amplifier has a gain of −1 when said low-side mixing mode is selected and said first amplifier has a gain of 1 when said high-side mixing mode is selected.

19. The mixer of claim 17, wherein when said phase converter provides a −90° phase conversion, said first amplifier has a gain of 1 when said low-side mixing mode is selected and said first amplifier has a gain of −1 when said high-side mixing mode is selected.

20. The mixer of claim 12, wherein said phase converter provides a 90 degree or −90 degree phase conversion.

* * * * *